(12) United States Patent
Thurgate et al.

(10) Patent No.: US 6,387,755 B1
(45) Date of Patent: *May 14, 2002

(54) METHOD AND SYSTEM FOR PROVIDING LOCALIZED GATE EDGE ROUNDING WITH MINIMAL ENCROACHMENT AND GATE EDGE LIFTING

(75) Inventors: Timothy J. Thurgate, Sunnyvale; Scott D. Luning, San Francisco, both of CA (US)

(73) Assignee: Advanced Micro Devices, Inc., Sunnyvale, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/992,616

(22) Filed: Dec. 17, 1997

(51) Int. Cl.[7] ............................................. H01L 21/336
(52) U.S. Cl. .................. 438/257; 438/263; 438/266
(58) Field of Search .................................. 438/257, 263, 438/264, 265, 266, 405, 410, 425, 593, 594

(56) References Cited

U.S. PATENT DOCUMENTS

| 5,847,427 A | * | 12/1998 | Hagiwara | .................... 257/324 |
| 5,907,188 A | * | 5/1999 | Nakajima et al. | ........... 257/751 |
| 5,963,806 A | * | 10/1999 | Sung et al. | .................. 438/266 |

* cited by examiner

Primary Examiner—Charles Bowers
Assistant Examiner—Jack Chen
(74) Attorney, Agent, or Firm—Sawyer Law Group LLP

(57) ABSTRACT

A system and method for providing a memory cell on a semiconductor is disclosed. The method and system include providing an oxide layer on the semiconductor and providing at least one gate stack disposed above the oxide layer. The at least one gate stack has a corner contacting the oxide layer. The method and system further include exposing at least the corner of the at least one gate stack and rounding at least the corner of the at least one gate stack.

10 Claims, 3 Drawing Sheets

METHOD AND SYSTEM FOR PROVIDING LOCALIZED GATE EDGE ROUNDING WITH MINIMAL ENCROACHMENT AND GATE EDGE LIFTING

FIELD OF THE INVENTION

The present invention relates to semiconductor processing and more particularly to a method and system for providing a memory cell having rounded gate edges with reduced gate edge lifting.

BACKGROUND OF THE INVENTION

Conventional flash memory cells include a source, a drain, a channel between the source and drain, and a gate stack. The gate stack includes at least a floating gate and a control gate disposed above the floating gate. Typically, the floating gate and control gate are comprised of polysilicon.

In order to provide a conventional memory cell, a tunnel oxide is typically grown on a semiconductor substrate. The gate stack layers are then deposited and etched to form the gate stack. Typically, an oxidizing step is then performed. Subsequently, source and drain implants can be provided.

The oxidizing step has several functions. After etching, the corners of the floating gate, such as the corner between the side and bottom of the floating gate are sharp. Electric fields are typically significantly stronger near corners of an object. To reduce these fields, the corner should be rounded. The oxidation step rounds these corners of the floating gate. In addition, the edge of the polysilicon forming the control gate and the floating gate is exposed after the gate stack is formed by etching. The oxidation step seals the polysilicon gates to prevent leakage of charge carriers during use.

Although a conventional memory cell formed as discussed above functions, the oxidation of the gate stack also causes the edge of the floating gate to lift. The oxide forms by oxidizing both the polysilicon of the floating gate and the semiconductor beneath the tunnel oxide. In addition to rounding the corner of the floating gate, the oxidation step also oxidizes a portion of the bottom of the floating gate and the semiconductor beneath the floating gate. Thus, a portion of the floating gate near the edge of the floating gate is separated from the underlying semiconductor by a distance greater than near the center of the floating gate. This phenomenon is known as gate edge lifting.

Gate edge lifting affects placement of the source of the conventional memory cell. Conventional memory cells are erased by tunneling of charge carriers between the floating gate and the source. The tunneling depends exponentially on the thickness of the oxide. For a source that is uniformly doped, tunneling occurs where the distance between the floating gate and the source is thinnest. Tunneling also increases with an increase in the dopant concentration in the source. Thus, tunneling occurs where the correct combination of a higher concentration of source dopant and thinner tunnel oxide above the source is found.

Because the gate edge lifts and because tunneling occurs where the tunneling oxide above the source is thinnest, the source of a conventional memory cell must be far enough under the gate to allow for erase despite the gate edge lifting. Thus, in conventional processing, a dopant for the source is driven far under the floating gate to account for the gate edge lifting. For a double diffuse source formed from phosphorus and arsenic, the arsenic is typically driven as far under the gate as possible. As a result, higher temperature drives are used to form the source. Because the correct combination of source dopant concentration and tunnel oxide thickness is difficult to control, erase characteristics of different memory cells may vary.

Because the source of a conventional memory cell must overlap the floating gate far enough to account for gate edge lifting, conventional memory cells must be made larger. It is desirable to decrease the size of conventional memory cells in order to increase the density of memory cells in an area of the semiconductor. However, as the source and drain of a conventional memory cell become closer, short channel effects adversely affect the behavior of the memory cell. For example, the threshold voltage of the memory cell may drop below a desired level, preventing the memory cell from functioning reliably. Thus, the distance between the source and drain should be as wide as possible for a particular floating gate size. Because of gate edge lifting, the source must be driven farther under the gate than would be required in the absence of gate edge lifting.

Accordingly, what is needed is a system and method for providing a memory cell having rounded floating gate corners in which gate edge lifting is reduced. The present invention addresses such a need.

SUMMARY OF THE INVENTION

The present invention provides a method and system for providing a memory cell on a semiconductor. The method and system comprise providing an oxide layer on the semiconductor, and providing at least one gate stack disposed above the oxide layer. The at least one gate stack has a corner contacting the oxide layer. The method and system further comprise exposing at least the corner of the at least one gate stack and rounding at least the corner of the at least one gate stack.

According to the system and method disclosed herein, the present invention reduces gate edge lifting while allowing for rounded gate corners, thereby allowing for a decrease in the overlap between the source and the gate stack without sacrificing erase characteristics.

DETAILED DESCRIPTION OF THE INVENTION

The present invention relates to an improvement in semiconductor processing. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown but is to be accorded the widest scope consistent with the principles and features described herein.

Figure 1:
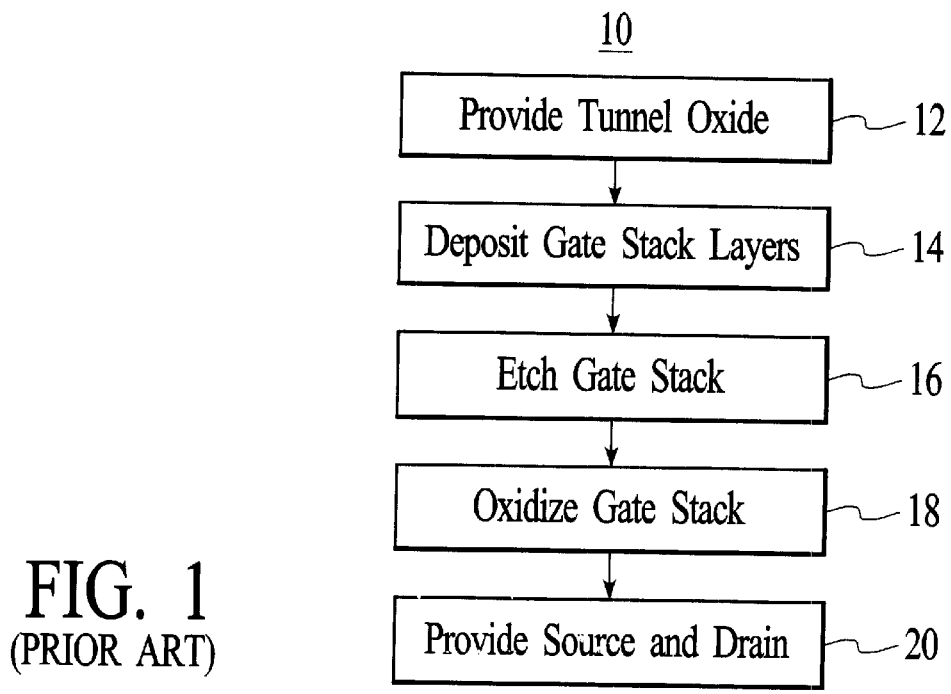
FIG. 1 is a flow chart of a conventional method for providing a flash memory cell.

FIG. 1 is a flow chart of a method 10 for providing a conventional flash memory cell. A tunnel oxide is typically grown on a semiconductor substrate via step 12. The gate stack layers are then deposited via step 14. These layers are then etched via step 16 to form the gate stack. The gate stack is then oxidized via step 18. A source and a drain are then provided via step 20. Thus, processing continues until the memory cell is completed.

Figure 2:
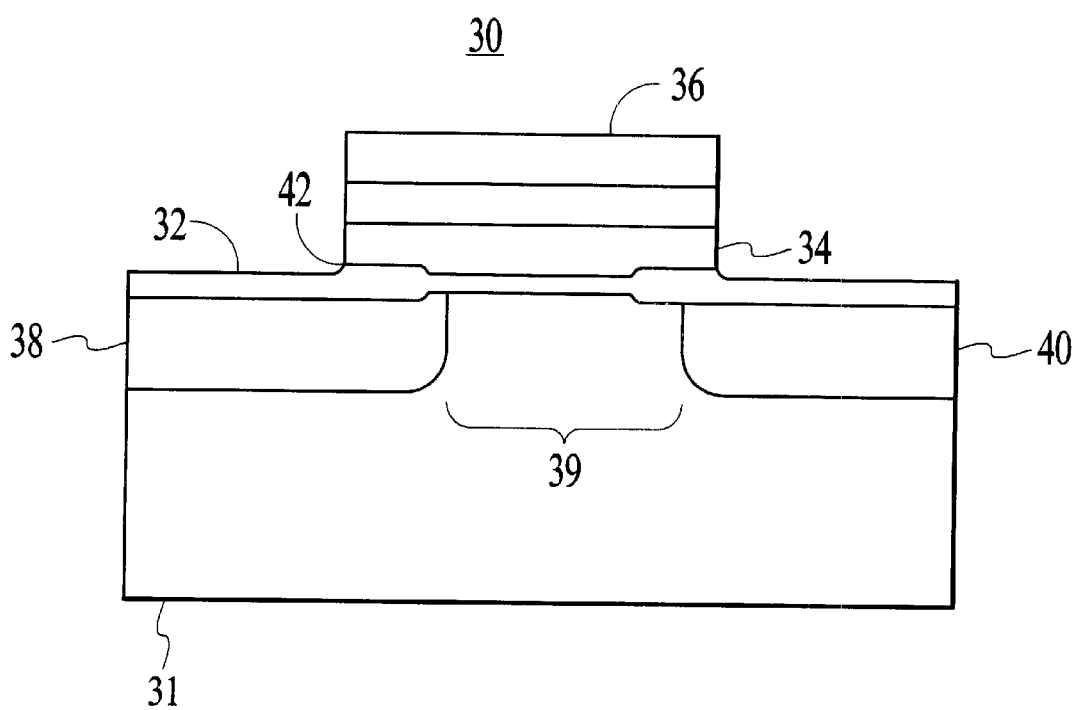
FIG. 2 is a is a block diagram depicting a conventional memory cell.

FIG. 2 depicts a conventional flash memory cell 30 formed in accordance with the method 10. The conventional memory cell 30 includes a tunnel oxide 32. The conventional memory cell 30 also includes gate stack having a floating gate 34 and a control gate 36. Typically the floating gate 34 and the control gate 36 are composed of polysilicon. Finally, the conventional memory cell 30 includes a source 38 and a drain 40. The area between the source 38 and the drain 40 is the channel 39.

Because of the oxidizing step 18, the corner 42 of the floating gate 34 is rounded. Prior to the oxidizing step 18, the corners of the gate stack, such as the corner 42 of the floating gate 34, are sharp. Electric fields are typically significantly stronger near corners of an object. To reduce these fields, the corner 42 should be rounded. The oxidation step 18 rounds the corners of the floating gate 34, reducing the electric field at the corner 42. In addition, the edges of the floating gate 34 and control gate 36 are sealed by an oxide layer, not shown. Consequently, leakage of charge carriers during use of the conventional memory cell 30 is prevented.

Although the conventional memory cell 30 functions, one of ordinary skill in the art will realize that the oxidation step 18 also causes the edge of the floating gate 34 to lift. The oxide which seals the floating gate 34 and rounds the corner 42 is formed by oxidizing both the floating gate 34 and the semiconductor 31 beneath the tunnel oxide 32. Closer to the edge of the floating gate 34, the floating gate 34 is separated from the source 38 by a larger distance. Thus, the gate edge has been lifted.

One of ordinary skill in the art will also realize that gate edge lifting requires that the source 38 in the conventional memory cell 30 be placed farther under the floating gate 34. The conventional memory cell 30 is erased by tunneling of charge carriers between the floating gate 34 and the source 38. The tunneling depends exponentially on the on the thickness of the tunnel oxide 32. For a source 38 that is uniformly doped, tunneling occurs where the distance between the floating gate 34 and the source 38 is smallest. Thus, tunneling occurs where the portion of the tunneling oxide 32 above the source 38 is the thinnest. Typically, the distance between the floating gate 34 and the source 38 decreases farther from the edge of the floating gate 34. In addition, tunneling increases with increasing concentration of source dopant. Typically, the concentration of source dopant increases in a direction from the center of the floating gate 34 to an edge of the floating gate 34 closest to the source 38. To increase tunneling and, therefore, facilitate erasure, the source 38 should be placed closer to the center of the floating gate 34, where gate edge lifting is minimal.

In order to place the source 38 where gate edge lifting is reduced, a dopant for the source 38 is driven far under the floating gate 34 to account for the gate edge lifting. For a double diffuse source 38 formed from phosphorus and arsenic, the arsenic is typically driven as far under the floating gate 34 as possible. As a result, higher temperature drives are used to form the source 38. Because the appropriate combination of a small distance between the floating gate 34 and the source 38 and a higher concentration of source dopant is difficult to control, where tunneling occurs during erase may differ between memory cells. This may cause different erase characteristics in different memory cells on the same semiconductor 31.

One of ordinary skill in the art will also realize that because the source of a conventional memory cell must overlap the floating gate far enough to account for gate edge lifting, the conventional memory cell 30 must be larger. It is desirable to decrease the size of conventional memory cell 30 to increase the density of memory cells in an area of the semiconductor. However, as the source 38 and drain 40 become closer, short channel effects adversely affect the behavior of the conventional memory cell 30. For example, the threshold voltage of the memory cell may drop below a desired level, preventing the conventional memory cell 30 from functioning reliably. Thus, to reduce short channel effects, the distance between the source 38 and drain 40 should be as wide as possible for a smallest possible floating gate 34 size. Because of gate edge lifting, the source 38 must be farther under the floating gate 34 than would be required in the absence of gate edge lifting. This reduces the length of the channel 39 for a particular floating gate 38 size. To both reduce short channel effects and account for gate edge lifting, therefore, the memory cell 30 is larger.

The present invention provides for a method and system for providing a memory cell having a rounded gate corner and reduced gate edge lifting. The method and system comprise providing an oxide layer, providing at least one gate stack disposed above the oxide layer, providing an etch of the oxide layer, and rounding the corner of the gate stack. The gate stack has a corner contacting the oxide layer. The etch of the oxide layer exposes the corner of the gate stack.

The present invention will be described in terms of a process for providing single flash memory cell having particular dopants. However, one of ordinary skill in the art will readily recognize that this method and system will operate effectively for other nonvolatile technology, numerous memory cells being provided using a single processing method, and different dopants.

Figure 3:
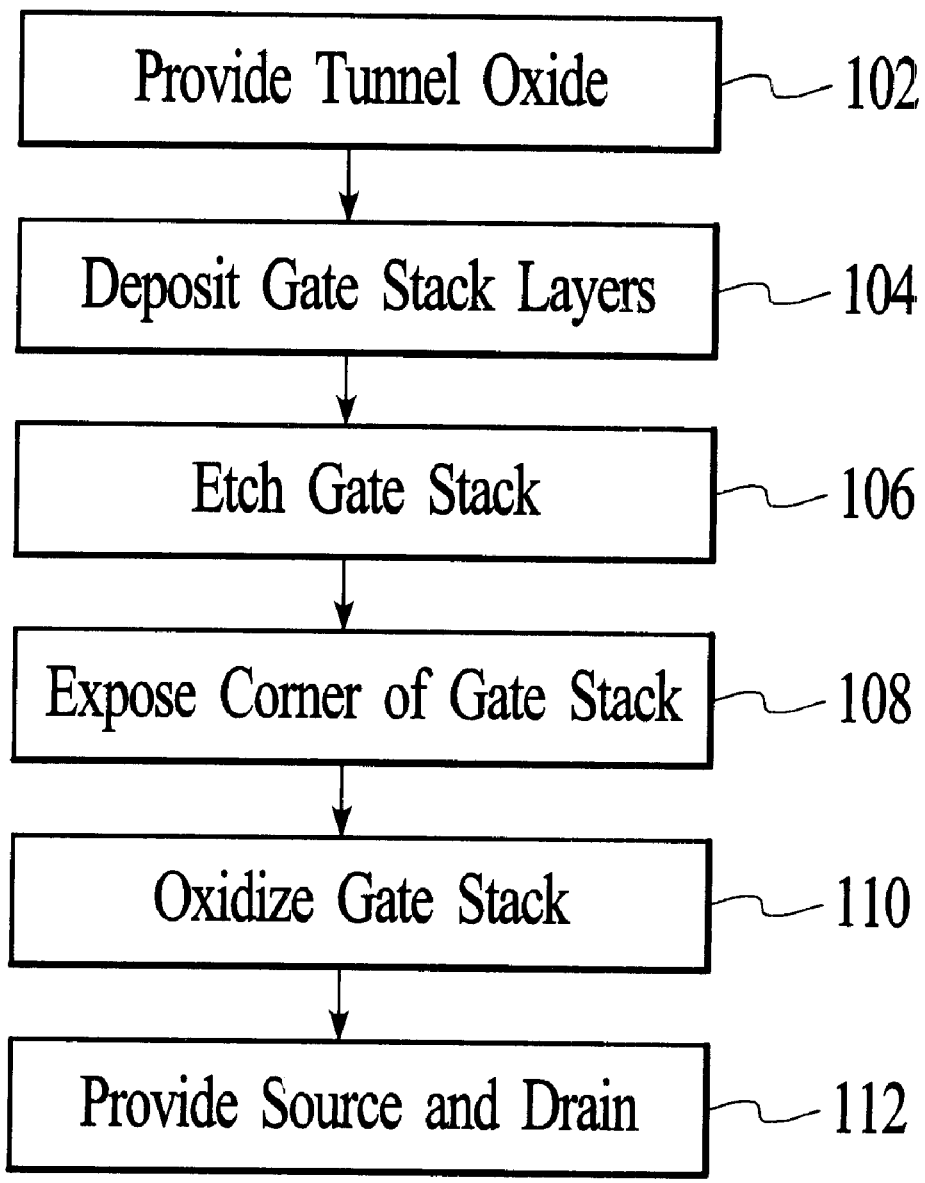
FIG. 3 is a flow chart of a method for providing a memory cell in accordance with the present invention.

To more particularly illustrate the method and system in accordance with the present invention, refer now to FIG. 3 depicting a flow chart of one method 100 in accordance with the present invention. Note that only relevant steps are depicted in the method 100. A tunnel oxide is provided via step 102. A gate stack is then provided by depositing the gate stack layers and etching the gate stack via steps 104 and 106, respectively. In one embodiment, providing the gate stack includes at least depositing and etching a floating gate layer and a control gate layer.

During the gate etch step 106 or shortly thereafter, at least a corner of the gate stack is exposed via step 108. In one embodiment, the corners are exposed using an oxide etch in step 108. In a preferred embodiment, the oxide etch, or other method of exposing the corner, used in step 108 has a significant isotropic component. In a preferred embodiment, the oxide etch step 108 is performed using a wet etch. Also in a preferred embodiment, the wet etch is provided using a weak hydrofluoric acid solution. However, nothing prevents the use of another type of etch. Because the etch is isotropic, the oxide will be removed approximately the same amount in all directions. Consequently, the amount of oxide removed horizontally, towards the center of the gate will be approximately the same as the amount of oxide removed vertically, towards the underlying semiconductor. Thus, in a preferred embodiment, the corners can be exposed without complete removal of the oxide layer in some areas or degrading oxide quality in under the gate stack. However, nothing prevents the method 100 from completely removing the oxide layer in exposed areas. Finally, in a preferred embodiment, the etch removes only enough of the oxide layer to expose the corners. It is estimated that the amount of oxide removed would be on the order of fifty to one hundred Angstroms.

The gate stack is then oxidized via step 110. Because the corners of the gate stack have been exposed, the gate stack oxidation step 110 can be very brief. Only minimal oxidation is used because the exposed corners of the gate stack are very rapidly rounded during the oxidation step 110. The source and drain are then provided via step 112. Processing then continues until the flash memory cell is completed.

Figure 4A:
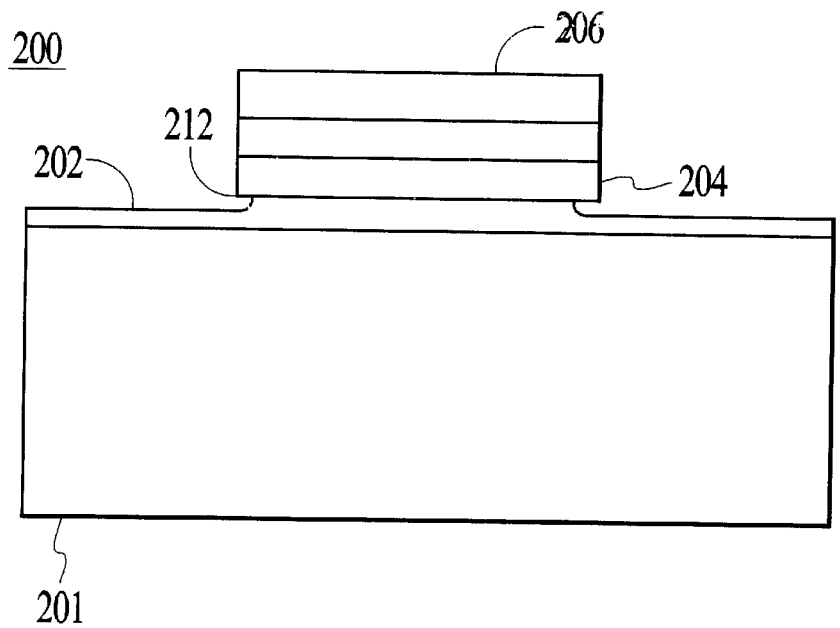
FIG. 4A is a block diagram depicting a memory cell in accordance with the present invention after an oxide etch.

FIG. 4A depicts a memory cell 200 in accordance with the present invention after the oxide etch step 108. The memory cell 200 includes an oxide layer 202 and a gate stack having a floating gate 204 and a control gate 206. The floating gate includes a corner 212. The corner 212 has been exposed by the step 108. Although the oxide layer 202 is depicted as not being completely removed, nothing prevents the removal of the oxide near or outside of the edge of the floating gate 204.

Figure 4B:
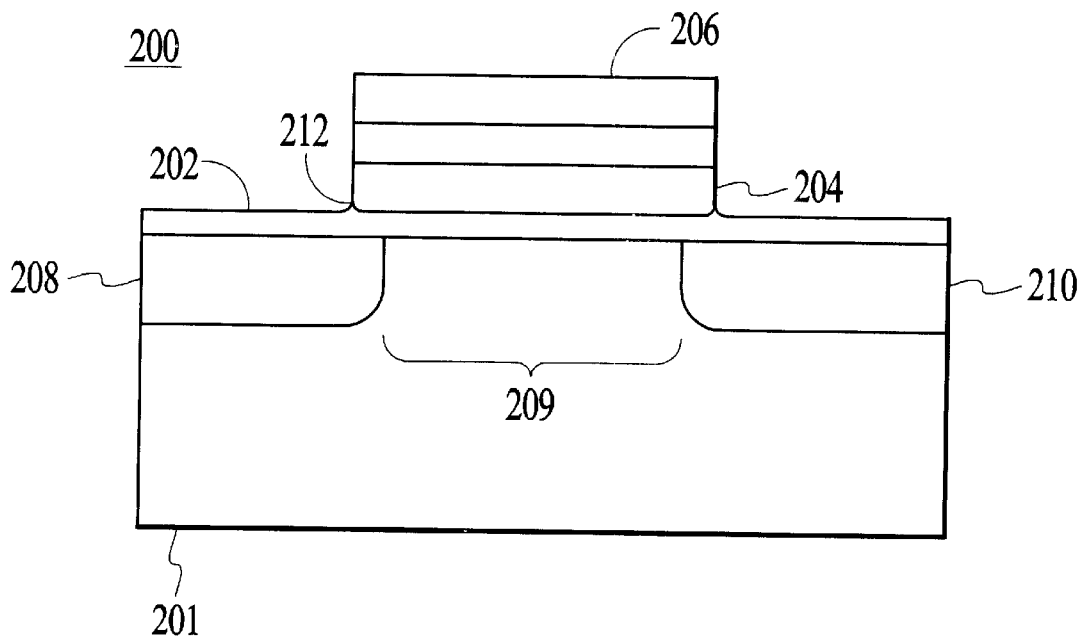
FIG. 4B is a block diagram depicting a memory cell in accordance with the present invention.

FIG. 4B depicts the memory cell 200 in accordance with the present invention after oxidizing step 110 and source and drain providing step 112 have been performed. The memory cell 200 also includes a source 208, a drain 210, and a channel 209 disposed between the source 208 and the drain 210. The corner 212 has been rounded in the oxidizing step 110. Because the corner 212 was exposed during the oxidizing step 110, the oxidizing step 110 was brief enough to no substantially lift the edge of the floating gate 204. In addition, the floating gate 204 and control gate 206 may be sealed by and oxide layer, not shown, which was formed during oxidizing step 110.

Because gate edge lifting is reduced, the thickness of oxide layer 202 through which charge carriers must tunnel during erase is relatively constant close to the corner 212 of the floating gate 204. As discussed above, tunneling is related to the thickness of the barrier between the floating gate 204 and the source 208. Because the thickness of the material through which charge carriers tunnel during erase is relatively constant, the source 208 may be placed closer to the edge of the floating gate 204. In other words, the overlap between the source 208 and the floating gate 204 can be reduced while retaining adequate erase characteristics.

Because the source 208 does not overlap the floating gate 204 as much as in a conventional memory cell 30, the required diffusion of the source dopants used to form the source 208 is reduced. Thus, the need for higher temperature drives of the source dopants are reduced. Because the thickness of material through which charge carriers tunnel during erase is relatively constant, the appropriate combination of distance between the source 210 and the floating gate 206 and the source dopant concentration for tunneling is more controllable. There is, therefore, less variation in where tunneling occurs for different memory cells. Erase characteristics across a memory are, therefore, more uniform.

The length of the channel 209 for a given floating gate 204 size is increased because the source 208 can be placed closer to the edge of the floating gate 204. Thus, the size of the memory cell 200 can be made smaller without substantially increasing short channel effects. Thus, smaller memory cells 200 and higher memory cell densities can be achieved.

A method and system has been disclosed for providing a memory cell having rounded corners and reduced gate edge lifting. Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method for providing a memory cell on a semiconductor substrate comprising the steps of:

(a) providing an oxide layer on the semiconductor substrate;

(b) providing at least one gate stack disposed above the oxide layer, the at least one gate stack having a corner contacting the oxide layer, the corner being at an edge of the gate stack, the gate stack including at least a floating gate and a control gate;

(c) exposing at least the corner of the at least one gate stack, wherein the corner comprises a portion of a vertical side surface and a portion of a horizontal bottom surface of the at least one gate stack by removing a portion of the oxide layer under the gate stack such that the portion of the horizontal bottom surface is exposed; and (d) rounding at least the corner of the at least one gate stack, after at least the corner of the at least one gate stack has been exposed.

2. The method of claim 1 wherein the at least the corner exposing step (c) further includes the step of:

(c1) providing an isotropic etch of the oxide layer.

3. The method of claim 2 wherein the isotropic etch providing step (c1) further includes the step of:

(c1i) etching the oxide layer without completely removing the oxide layer.

4. The method of claim 3 wherein the at least the corner rounding step (d) further includes the step of:

(d1) oxidizing the at least one gate stack at least until the corner is rounded.

5. The method of claim 4 wherein the edge of the at least one gate stack including the corner is not lifted by oxidation of the at least one gate stack.

6. The method of claim 5 wherein the at least one gate stack providing step (b) further includes the steps of:

(b1) providing a plurality of gate stack layers; and (b2) etching the plurality of gate stack layers to provide the at least one gate stack.

7. The method of claim 6 wherein the plurality of gate stack layers providing step (b1) further includes the step of:

(b1i) providing at least one polysilicon layer.

8. The method of claim 7 further comprising the step of:

(e) providing at least one source at the edge of the gate stack, a portion of the source disposed under the at least one gate stack.

9. The method of claim 8 further comprising the step of:

(f) providing at least one drain located in opposition to the source.

10. The method of claim 6 wherein the plurality of gate stack layers etching step (b2) and the isotropic etch providing step (c1) are performed in a single step.

* * * * *